US005473165A

United States Patent [19]
Stinnett et al.

[11] Patent Number: 5,473,165
[45] Date of Patent: Dec. 5, 1995

[54] METHOD AND APPARATUS FOR ALTERING MATERIAL

[76] Inventors: Regan W. Stinnett, 1033 Tramway La. NE., Albuquerque, N.M. 87122; John B. Greenly, 184 Ludlowville Rd., Lansing, N.Y. 14882

[21] Appl. No.: 153,248

[22] Filed: Nov. 16, 1993

[51] Int. Cl.$^6$ ............................................. G21K 5/04
[52] U.S. Cl. .................. 250/492.21; 250/492.3; 250/492.1
[58] Field of Search ............ 250/492.21, 492.2, 250/492.1, 492.3; 427/523; 437/2, 174

[56] References Cited

U.S. PATENT DOCUMENTS

| | | | |
|---|---|---|---|
| 4,447,761 | 5/1984 | Stinnett | 250/423 R |
| 4,587,430 | 5/1986 | Adler | 250/423 R |
| 4,733,073 | 3/1988 | Becker et al. | 250/423 P |
| 4,733,091 | 3/1988 | Robinson et al. | 250/442.11 |
| 4,764,394 | 8/1988 | Conrad | 427/38 |

OTHER PUBLICATIONS

Harjes, H. C. et al, "Status Of the Repetitive High Energy Pulsed Power Project," Digest of Technical Papers, Proceedings 8th IEEE International Pulsed Power Conference, pp. 543–548, San Diego, Calif., Jun. 1991.
Greenly, J. B. et al, "Plasma–Anode Ion Diode Research At Cornell: Repetitive–Pulse, and 0.1 TW Single–Pulse Experiments," Proceedings 8th International Conf. on High–Power Particle Beams, pp. 199–206, Novosibirsk, USSR, Jul. 1990.
Stinnett, R. W. et al, "Surface Treatment With Pulsed Ion Beams," Division of Plasma Physics, Seattle, Wash., Nov. 1992.

Primary Examiner—Jack I. Berman
Assistant Examiner—James Beyer
Attorney, Agent, or Firm—Gregory A. Cone; Timothy D. Stanley

[57] ABSTRACT

Methods and apparatus for thermally altering the near surface characteristics of a material are described. In particular, a repetitively pulsed ion beam system comprising a high energy pulsed power source and an ion beam generator are described which are capable of producing single species high voltage ion beams (0.25–2.5 MeV) at 1–1000 kW average power and over extended operating cycles ($10^8$). Irradiating materials with such high energy, repetitively pulsed ion beams can yield surface treatments including localized high temperature anneals to melting, both followed by rapid thermal quenching to ambient temperatures to achieve both novel and heretofore commercially unachievable physical characteristics in a near surface layer of material.

33 Claims, 6 Drawing Sheets

Before

After

METHOD AND APPARATUS FOR ALTERING MATERIAL

The United States Government has rights in this invention pursuant to Contract No. DE-AC04-76DP00789 between the Department of Energy and American Telephone and Telegraph Company.

BACKGROUND OF THE INVENTION

The present invention relates generally to methods and apparatus for altering material. More particularly, the present invention describes methods and apparatus for thermally altering the near surface characteristics of a material with a high energy, repetitively pulsed ion beam.

A variety of techniques have been developed for thermally altering the near surface characteristics of a material using ion beam, electron beam, x-ray and laser technologies. Unfortunately, the dramatic expectations of such technologies have largely gone unfulfilled. In particular, the use of lasers for thermally altering the near surface characteristics of materials has met with only limited commercial success. The more significant reasons for such poor reception are: 1) high cost per area treated, 2) short (<50 nm) deposition depths in metals, 3) high reflectivity of metal surfaces, 4) large variations in photon absorption leading to non uniform treatment due to defects and non-uniformities in treated surfaces, and 5) low power levels require the use of small (typically $\leq 1$ cm$^2$) beam spots which must then be swept across a surface to treat large areas which can lead to undesirable mechanical and electrical edge effects in surfaces treated with swept beams.

The use of ion beams for thermally altering the near surface characteristics of a material, while the most promising, has been fraught with the most substantial problems. Most notable of the limitations with existing ion beam technologies have been: 1) high costs per area treated, 2) the inability to generate a large number of pulses without the costly replacement of ion beam generator components, 4) low repetition rates, 5) low average power, and 6) the inability to reliably produce a uniform ion beam of a single selectable ion species. Typical ion beam generators use dielectric surface arcing on an anode as a source of ions and thereafter magnetically or geometrically direct and focus the generated ion beam onto the material of interest. This surface arcing (also called "flashover") destroys the anode surface in <100 pulses, and produces a mixed species of ions that cannot be adjusted. Other difficulties arising from flashover include: the production of large quantities of neutral gas that makes high repetition rate difficult, generated debris can contaminate surfaces being treated, and non uniformity and irreproducibility of the beam in some cases due to the localized and difficult to control nature of flashover.

Present ion beam generators are typically "one shot" devices, i.e. they operate at repetition rates <<1 Hz. The principal limitations in operating existing ion beam generators at repetition rates >>1 Hz are threefold. First, the inability to repetitively generate high voltage (>0.25 MeV), low impedance (<<100 Ω) high average power (> 10$^9$ watts), electrical pulses in the ~range of 30–500 nanoseconds in duration. Second, the inability of the ion beam generator to operate repetitively for an extended number of operating cycles (>>10$^3$) without replacement of major components. Third, the inability to operate with electrical efficiencies >5%. These limitations alone have made it impossible to consider industrial applications of the ion beam technology for surface treating materials.

The present apparatus for generating high energy, repetitive ion beams has over come the limitations of existing ion beam generators and provides a cost effective processing technology for thermally altering the near surface characteristics of materials.

SUMMARY OF THE INVENTION

The present invention provides a system for generating a high energy, ion beam repetitively over an extended number of operating cycles. In particular, the present invention provides an ion beam generator capable of high average power and repetitive operation over an extended operating cycle for thermally treating large surface areas of a material at low cost. The ion beam generator comprises a high energy, pulsed power system and an ion beam source both capable of high repetition rates, and both have an extended operating life. High energy, repetitively pulsed ion beams produced according to the present invention can produce surface treatments ranging from localized high temperature anneals to melting, both followed by rapid thermal quenching to ambient temperatures. In metals this can produce complex surface alloys, liquid phase mixing of layers of different materials, and/or non-equilibrium microstructures including amorphous, disordered crystalline, and nanocrystalline phases. Other applications include etching and cross-linking of polymers, surface glazing and sealing of ceramic surfaces and cost-effective dry processes for surface deburring, polishing, and cleaning without the use of solvents. The unique energy deposition in-depth characteristic of high energy, repetitively pulsed ion beams also allows this technology to be used as a new technique for bonding of films to substrates. The depth of treatment can be controllable by varying the ion energy and species as well as pulse duration or length.

DETAILED DESCRIPTION OF THE INVENTION

The present invention provides an ion beam generator capable of high average power and repetitive operation over an extended number of operating cycles for thermally treating large surface areas of materials at commercially attractive costs. In particular, the ion beam generator of the present invention can produce high average power (1–1000 kW) pulsed ion beams at 0.25–2.5 MeV energies and pulse durations or lengths of 30–500 nanoseconds (ns). The ion beam generator can directly deposit energy in the top 1–50 micrometers (µm) of the surface of any material. The depth of thermal treatment can be controlled by varying the ion energy and species as well as the pulse length.

Figure 1:
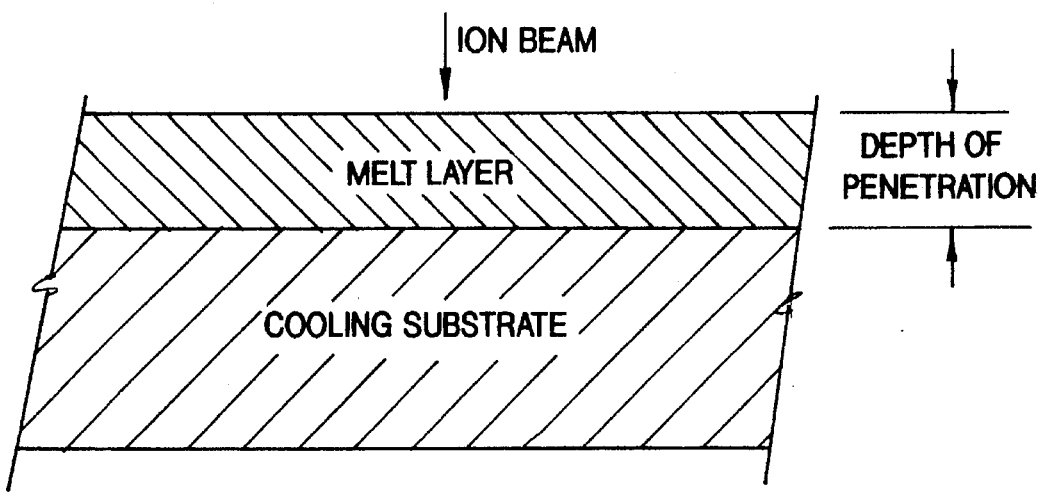
FIG. 1 depicts the deposition of ion beam energy in a near surface layer raising its temperature to melt with thermal diffusion into the underlying substrate.

Irradiating a material with ion beams in accordance with the present invention is a thermal process that does not significantly change the atomic composition of the material. Instead it thermally heats the near surface using typically 3×10$^{13}$ ions/cm$^2$ per pulse, only approximately 10$^{-5}$–10$^{-3}$ atomic percent of the sample density. Deposition of ion beam energy in a thin near surface layer allows melting of the layer with relatively small energies (typically 1–10 J/cm$^2$) and allows rapid cooling of the melted layer by thermal diffusion into the underlying substrate as depicted in FIG. 1. The relatively small energy densities needed for treatment together with the high instantaneous powers available using the present invention allows large surfaces areas (up to 1000 cm$^2$) to be treated with a single ion beam pulse greatly reducing or eliminating edge effects at the transition between treated and untreated areas. The relatively short ion beam pulse lengths, preferably ≦200 ns, developed by the ion beam generator limit the depth of thermal diffusion, thus allowing the treated/melted region to be localized to a selected depth.

Typical cooling rates of the present invention (10$^8$–10$^{10}$ K/sec) are sufficient to cause amorphous layer formation in some materials, fine grain structures in some materials, the production of non-equilibrium microstructures (nano-crystalline and metastable phases), and the formation of new alloys by rapid quenching and/or liquid phase mixing of layers of different materials. Such rapid thermal quenching (>10$^8$ K/sec) can significantly improve corrosion, wear and hardness properties of the treated near surface layer. Other applications of the present invention can include etching and cross linking of polymers, surface glazing and sealing of ceramic surfaces for reduced porosity, and a cost-effective, solvent-free process for surface deburring, polishing, cleaning, and oxide layer removal.

Figure 2:
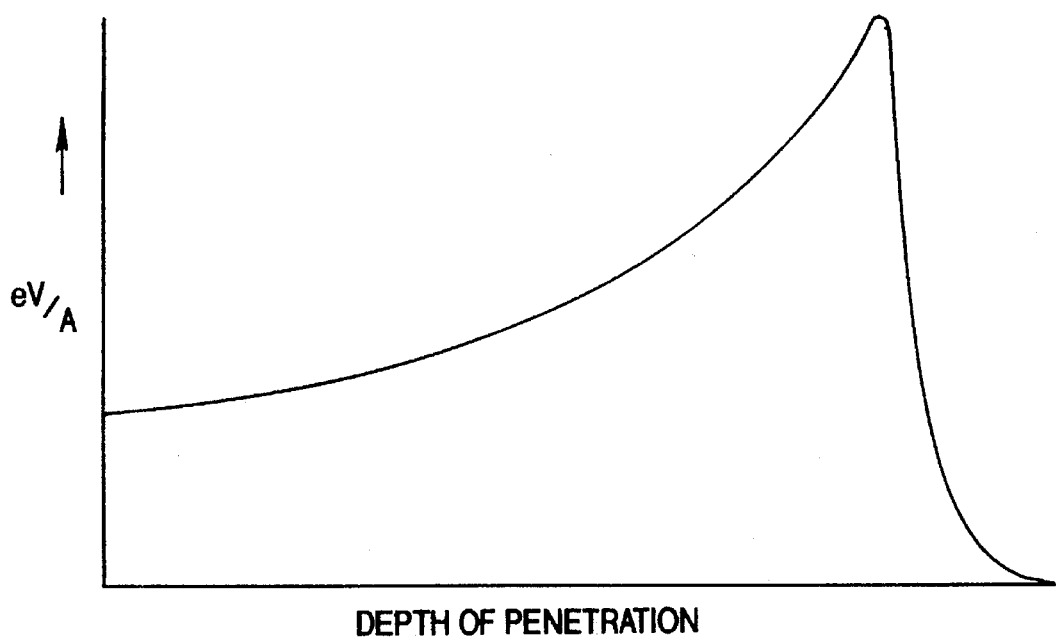
FIG. 2 depicts the in depth deposition of energy in steel for a 900 keV proton beam.

The unique energy deposition as a function of depth, as depicted in FIG. 2, also allows ion beams produced according to the present invention to be used for bonding films to substrates and mixing interface materials by liquid phase mixing. Surface modification by rapid, localized melting, with or without vaporization of the surface can be used for annealing of surfaces and modifying surface microstructure, including metals, semiconductors, and polymers. The microstructures produced will be determined by the choice of material, the beam intensity, energy, composition, and the number of pulses used to treat an area.

The ion beam generator can also produce pulsed ion beams with intensities sufficient to vaporize surface layers. Applications of this capability include the production of high energy vapor for depositing films. The ion beam generator can also be used for ion implantation at relatively high voltages (0.25–2.5 MV), with greatly reduced cost, greater depths, and larger treatment area due to the higher energy per pulse, higher voltage, and low cost, repetitive capability of this new technology. At higher intensities, the ion beam generator can also be used to produce surface ablation that creates shock waves that propagate into materials, causing dislocations and increasing the hardness of the material.

The ion beam generator of the present invention is composed of two major components: a high energy, pulsed power system and an ion beam source both capable of high repetition rates and both having extended operating lives.

The first of these components is a compact, electrically efficient, repetitively pulsed, magnetically switched, pulsed power system capable of 10$^9$ pulse operating cycles as generally described by H. C. Harjes, et al, *Pro 8th IEEE Int. Pulsed Power Conference* (1991) all of which is incorporated by reference herein. The power system can operate continuously at a pulse repetition rate of 120 Hz delivering up to 2.5 kJ of energy per pulse in 60 ns pulses. The power system can deliver pulsed power signals of 30–500 ns duration with ion beam energies of 0.25–2.5 MeV. The power system can operate at 50% electrical efficiency from the wall plug to energy delivered to a matched load. The power system uses low loss pulse compression stages incorporating, for example, low loss magnetic material and solid state components, to convert AC power to short, high voltage pulses. High electrical efficiency is important in reducing the cooling requirements and the capital and operating costs of the power system. The ability to produce voltages from 250 kV to several MV by stacking voltage using inductive adders incorporating low loss magnetic material is also an important feature when high voltages are needed although it is also possible to use a single stage, eliminating the need for the adder. The power system can operate at relatively low impedances (<<100 Ω) which also sets it apart from many other repetitive, power supply technologies such as transformer-based systems. This feature is necessary to allow high treatment rates and the treatment of large areas (up to 1000 cm$^2$) with a single pulse so as to reduce edge effects occurring at the transition between treated and untreated areas.

Figure 3:
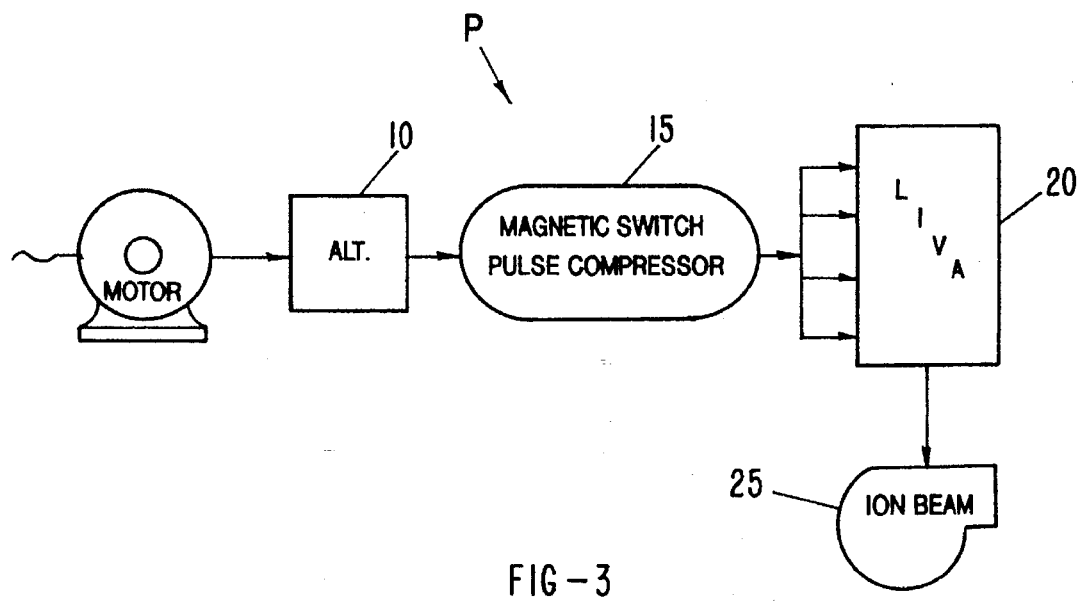
FIG. 3 is a schematic of the pulsed power system of the present invention.

A block diagram of the power system P is shown in FIG. 3. From the prime power input, several stages of magnetic pulse compression and voltage addition are used to deliver a pulsed power signal of up to 2.5 MV, 60 ns FWHM, 2.9 kJ pulses at a rate of 120 Hz to an ion beam source. The power system P converts AC power from the local power grid into a form that can be used by the ion beam source. In one embodiment of the invention, the power system P comprises a motor driven 600 kW, 120 Hz alternator 10. In the unipolar mode it provides 210 A rms at a voltage of 3200 V rms with a power factor of 0.88 to a pulse compressor system 15. In an alternative embodiment, the alternator 10 can be replaced by a variable frequency modulator (not shown). Such modulator can deliver a 5 kJ, (1–cos ωt) voltage pulse to the pulse compressor system 15 with a time to peak that permits the elimination of the first 2 or 3 stages in the pulse compressor system 15. The modulator can have a variable pulse repetition frequency (prf) and consequently will be a more flexible power source for the ion beam source (i.e. the input power can be adjusted by simply changing the prf).

The pulse compression system 15 can provide unipolar, 250 kV, 15 ns rise, 60 ns FWHM, 4 kJ pulses, at a rate of 120 Hz, to a linear inductive voltage adder (LIVA) 20. In one embodiment, the pulse compression system 15 is a common magnetic pulse compressor composed of a plurality of magnetic switches (i.e. saturable reactors) the operation of which is well known to those skilled in the art. In order to satisfy the systems performance requirements, the pulse compression system 15 should have an efficiency 80% and be composed of high reliability components with very long lifetimes ($\sim 10^9$–$10^{10}$ pulses). Magnetic switches are preferably used in all of the pulse compression stages because they can handle very high peak powers (i.e. high voltages and currents), and because they are basically solid state devices with the potential to satisfy the lifetime requirement.

The LIVA 20 is a liquid dielectric insulated voltage adder and can deliver nominal 2.5 MV, 2.9 kJ, pulses at a rate of 120 Hz to the ion beam source 25. The nominal output pulse of the LIVA 20 is trapezoidal with 15 ns rise and fall times and 60 ns FWHM.

The second component of the present invention is an ion beam source or accelerator capable of operating repetitively and efficiently to transform the pulsed power signal from the power system efficiently into an ion beam as described generally by J. B. Greenly et al, "Plasma Anode Ion Diode Research at Cornell: Repetitive Pulse and 0.1 TW Single Pulse Experiments", *Proceedings of 8th Intl. Conf. on High Power Particle Beams* (1990) all of which is incorporated by reference herein. The ion beam source is capable of operating at repetitive pulse rates of 100 Hz continuously with long component lifetimes $>10^6$. Preferably, the ion beam source comprises a magnetically-confined anode plasma (MAP) source, which draws ions from a plasma anode rather than a solid dielectric surface flashover anode used in present single pulse ion beam sources. The MAP source can provide pure beams of different ion species without employing components or techniques that have intrinsically short lifetimes. The ion beam generated is pulsed rather than continuous, allowing more compact, less expensive equipment to achieve high ion energies. Any ion can be used to deposit the energy. Protons have the greatest penetration depth of any ion and thus provide the greatest treatment depth while higher mass ions can deposit their energy at lesser depths.

Figure 4:
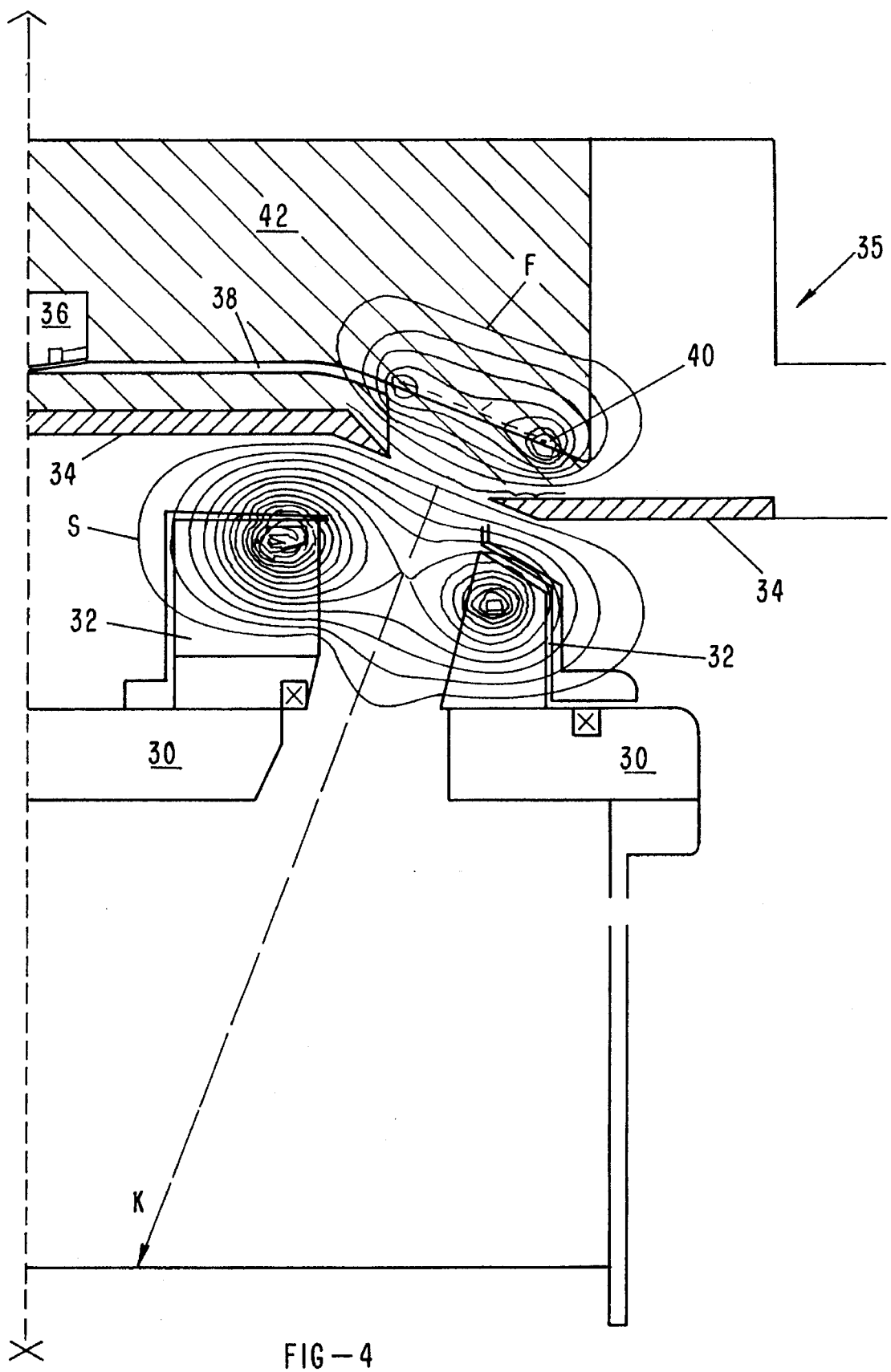
FIG. 4 is a schematic of the MAP source of the present invention.

The MAP source M is shown in FIG. 4. In particular, FIG. 4 is a partially cross-sectional view of one symmetric side of the MAP source M. The MAP source M produces an annular ion beam K which can be brought to a broad focus symmetric about the axis X—X shown. In the cathode electrode assembly 30 slow (1 µs rise time) magnetic field coils 32 produce magnetic flux S which provides the magnetic insulation of the accelerating gap between the cathode 32 and the anode electrode assembly 34 and which is connected to the output of the pulsed power system (not shown). The anode electrodes 34 also act as magnetic flux shapers.

The MAP M source operates in the following fashion: a fast gas valve 36 on the axis of anode assembly 35 produces a rapid (200 µs) gas puff which is delivered through a supersonic nozzle 38 to produce a highly localized volume of gas directly in front of the surface of a fast driving coil 40 located in an insulating structure 42. After pre ionizing the gas with a 1 µs induced electric field, the fast driving coil 40 is energized, inducing a loop voltage of 20 kV on the gas volume, driving a breakdown to full ionization, and moving the resulting plasma toward the flux shaping electrodes 34 in about 1.5 µs, to form a thin magnetically-confined plasma layer. The pulsed power signal from the power system is then applied to the anode assembly 35, accelerating ions from the plasma to form the ion beam K. The slow (S) and fast (F) magnetic flux surfaces, at time of ion beam extraction, are also shown.

The plasma can be formed using a variety of gases. This ion source system can use any gas (including hydrogen, nitrogen and argon) or high vapor pressure liquid or metal to produce a pure source of ions without consuming or damaging any component other than the gas supplied to the source. The ion beam K propagates 20–30 cm in vacuum ($\sim 10^{-3}$) to a broad focal area (up to 1000 cm$^2$) at the target plane where material samples are placed for treatment and can thermally alter areas from 50 cm$^2$ to 1000 cm$^2$.

Operation of the MAP source depends in part on the ability to provide ions at current densities exceeding by factors of several those available using standard space charge limited flow defined by the geometric gap and voltage. This is done by forming a virtual cathode consisting of electrons emitted from the cathode near the ion source on the anode.

The present invention provides a system and a process for generating high voltage ion beams repetitively over an extended number of operating cycles in a manner that satisfies several criteria and constraints imposed by the use of this technology for the efficient treatment of surfaces in commercial applications. In particular, the present invention comprises a pulsed power system and an ion beam source that are designed and combined in such a way as to satisfy the following criteria.

Pulse Length

The operation of high current, pulsed ion beam source depends in part on the ability to provide ions at current densities exceeding by factors of several those available using standard space charge limited flow defined by the geometric gap and voltage. This is done by forming a virtual cathode consisting of electrons emitted from the cathode near the ion source on the anode. A carefully optimized magnetic field topology is required to confine these electrons to form a sheath extending from the cathode to the anode in the ion emitting region of the anode. In the simplest model these electrons fill the gap in a few nanoseconds, providing a space charge profile in the gap that allows ion current densities to be much larger than those available without the virtual cathode formed by the electron sheath filling the anode-cathode gap. Experiments show that the delay in obtaining enhanced ion current density is 10–20 ns. This places a lower limit on the pulse length required for reasonable efficiency of the system. Based on this information the pulse length above half voltage points should be at least 30 ns.

Voltage, Current, and Impedance

The voltage, current and impedance of the pulsed power system required for effective, repetitive ion beam surface treatment is constrained by several factors. These include the need to generate large enough voltages to obtain the needed depth of penetration of ions into materials. This voltage is at least 250 kV for multi-micron penetration depth and extends to several MV. A typical operating voltage is 0.75 MV. The energy deposition depth of protons in steel is approximately 5 microns at this voltage. The current density needed to provide 5 J/cm$^2$, a typical level needed to melt surfaces to this depth, is approximately 100 A/cm$^2$ for a 60 ns pulse. In order to treat a 100 cm$^2$ area (large enough to minimize edge effects) a total ion current of 10,000 Amperes is needed. A 67% ion efficiency gives total current and impedance requirements of 15,000 Amperes and 50 Ω respectively. In general these considerations lead to an ion source impedance significantly less than 100 Ω, at voltages of at least 250 kV.

Ion Beam Source

The ion beam source must satisfy several criteria that are unique to its combination in repetitively pulsed, long lifetime, high voltage systems for pulsed ion beam treatment of surfaces. The ion beam source must produce only low levels of gas during operation to prevent vacuum degradation beyond the $1 \times 10^{-3}$ Torr level between pulses. The ion beam generated must be extractable through any insulating magnetic field with little or no rotation to allow propagation of the ion beam in a field-free region and focusing of the beam at intensities up to several tens of Joules/square centimeter on a material surface at least 20 centimeters away from the ion beam source. Many ion beam systems, including previous Magnetically confined Anode Plasma systems were fundamentally incapable of this because of incompatible magnetic field configurations in the diode (ion beam generating section). In particular, previous MAP sources produced an ion beam which rotated. Such rotation can result in the rapid dispersal of the ion beam as it propagates in free space. In the present invention it is necessary for the ion beam to travel up to 20–30 cm to a material surface and as such rotation of the ion beam is unacceptable.

EXAMPLES

Applications of present invention include production of low cost materials with treated surfaces for handling corrosive environments and treatment of large area metal sheets and critical components used in manufacturing and other areas where hardness, toughness and corrosion or wear resistance are important. It can also be used to produce smooth, crack-resistant ceramic surfaces by melting and re solidification using pulsed ion beams. By varying ion beam deposition levels and pulse durations it is also possible to use this technology for either surface cleaning or annealing. At high deposition levels (~30 J/cm$^2$) it is possible to do shock hardening of materials. Polymer processing and ion implantation can be done at lower deposition levels.

Figure 5:
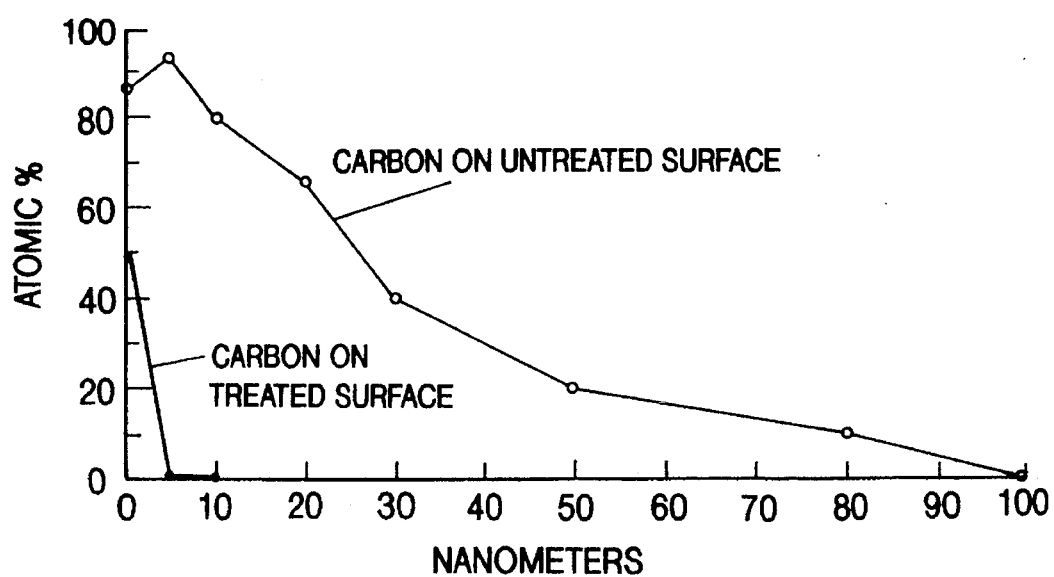
FIG. 5 depicts the effectiveness in removing a 100 nm thick coating of machining oil from a stainless steel 304 sample. After treatment with an ion beam of 1–2 Joules per square centimeter of 0.75 MeV carbon ions the hydrocarbon contamination layer was removed leaving only normal atmospheric contamination.
Figure 6:
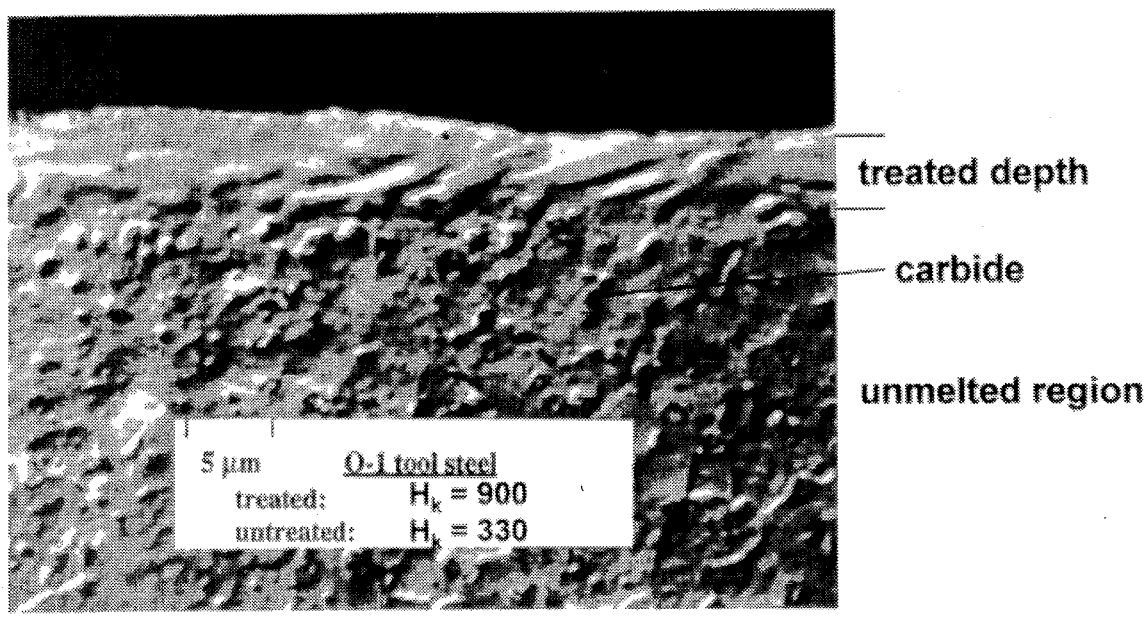
FIG. 6 is a cross sectional view of an 0–1 tool steel sample showing the effects of rapid surface melting and cooling by a 60 ns, 10 J/cm$^2$, 1 MeV mixed proton and carbon beam which resulted in increased hardness as well as a mixture of amorphous and fine grained material with retained metastable austenite and dissolved carbide precipitates retained in solution.
Figure 7B:
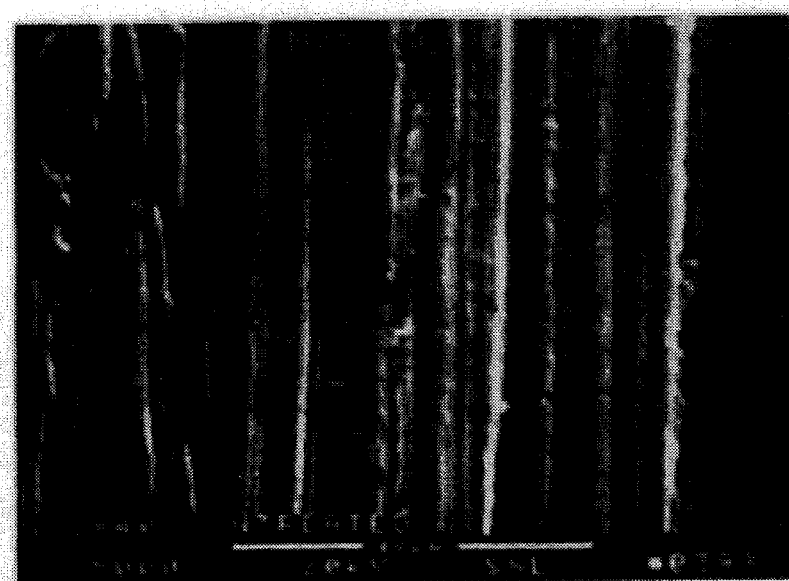
FIGS. 7a depicts a sample of Ti-6A1-4V alloy after treatment with a 300 keV, 2–4 J/cm$^2$ beam of mixed protons and carbon resulting in polishing of pre-existing machining marks with 10 μm roughness depicted in FIG. 7b to <1 μm.
Figure 7A:
Figure 8A:
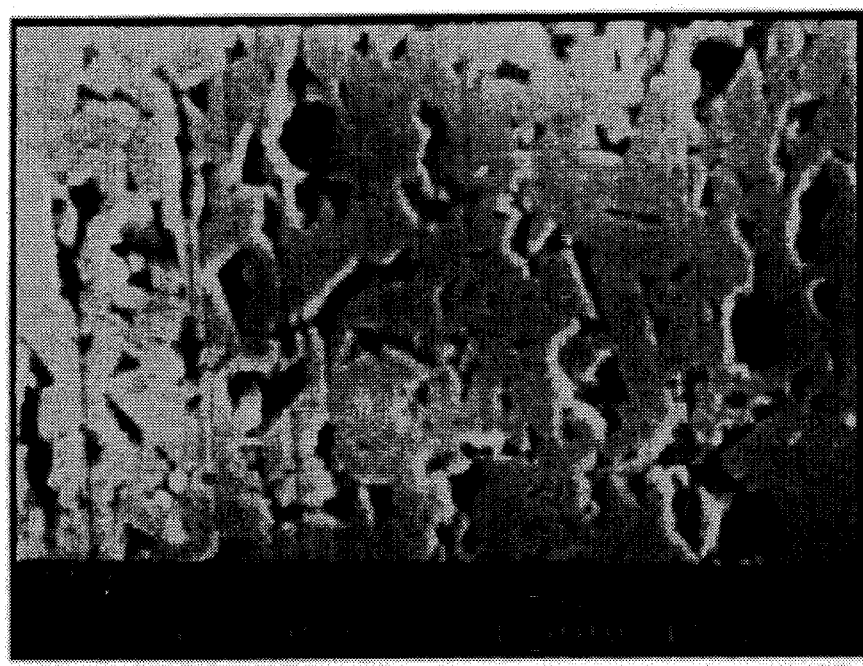
FIGS. 8a and 8b depict the before and after results of polishing an alumina sample which was subjected to a 60 ns, 10 J/cm$^2$, 1 MeV beam of mixed protons and carbon resulting in surface melting and re-solidification.
Figure 8B:
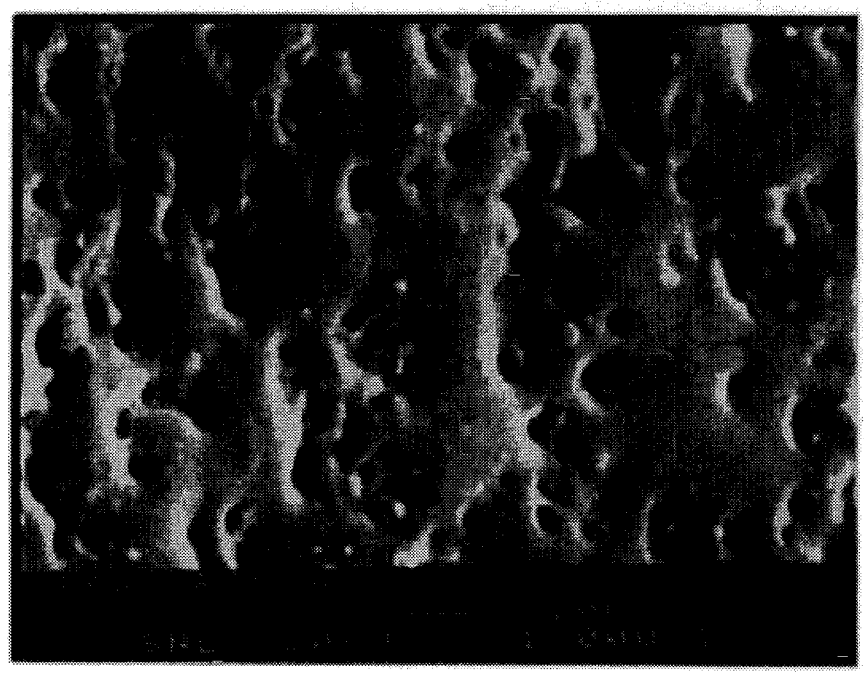

Examples of thermal surface treatment using this process are shown in FIGS. 5, 6, 7a, 7b and 8a, 8b. Surface cleaning or preparation without the use of organic solvents, can be accomplished by choosing higher mass ions (e.g. nitrogen, carbon) to deposit all of the beam energy in an approximately 1 μm thin region at the surface of the material, producing high surface temperatures which vaporize this contaminant-containing layer without significantly disturbing the underlying material. In particular, FIG. 5 depicts a stainless steel 304 sample, which was initially coated with machining oil, producing a 100 nm thick coating of hydrocarbons, after treatment with 1–2 Joules per square centimeter of 0.75 MeV carbon ions the hydrocarbon contamination layer was removed leaving only normal atmospheric contamination FIG. 6 is a cross sectional view of an 0–1 tool steel sample showing the effects of rapid surface melting and cooling after exposure by a 60 ns, 10 J/cm$^2$, 1 MeV mixed proton and carbon beam which resulted in increased hardness as well as a mixture of amorphous and retained metastable austenite with dissolved carbide precipitates that are retained in solution. FIGS. 7a depicts a sample of Ti-6A1-4V alloy after treatment with a 300 keV, 2–4 J/cm$^2$ beam of mixed protons and carbon resulting in polishing of preexisting machining marks with 10 μm roughness to <1 μm depicted in FIG. 7b. By inducing surface melting, porous dielectric films can be sealed or metal surfaces "polished" by material reflow. FIG. 8 depicts a sample of polished alumina which was subjected to a 60 ns, 10 J/cm$^2$, 1 MeV beam of mixed protons and carbon resulting in surface melting and re-solidification.

Unlike lasers which deposit energy to metals in the near surface (≈30 nm) only, an ion beam deposits its energy throughout its penetration depth extending to several microns. Additionally ion beams have the unique capability to deposit energy preferentially near the end of their penetration depth, in the interior of the sample, due to the inverse dependence of ion stopping power and energy. In addition to improving adhesion between the coating and substrate over large areas, the thermal fatigue resistance can also be enhanced. In a ceramic/metal system thermal-expansion-generated stresses at the boundary can be distributed over a relatively thick boundary layer following pulsed melting rather than being concentrated at the original atomically sharp interface. The flexibility of choosing the ion beam species and energy density provide substantial control over the degree of mixing, especially for dissimilar materials.

Another related application of this technology is in the use of its rapid quenching and surface smoothing capability to produce thin layers of amorphous material with much higher quench rates and at much lower cost than is possible using existing splat-quenching techniques. The use of this technology to form very fine grain materials is also valuable in advanced battery applications.

The capability of the present invention for producing high purity, high average power ion beams results in the potential for a new, low cost, compact surface treatment technology capable of high volume commercial applications and new treatment techniques not possible with existing systems. Having thus described the present invention with the aid of specific examples, those skilled in the art will appreciate that other similar combinations of the capabilities of this technology are also possible without departing from the scope of the claims attached herewith.

We claim:

1. A method of surface treating a material, comprising the step of irradiating a surface of the material with a repetitively pulsed ion beam, wherein each spatially contiguous pulse of the pulsed ion beam has a duration of ≦500 ns at an accelerating gap between a cathode and an anode assembly, a total beam energy delivered to the material of >1 Joule/pulse, an impedance of < about 100 Ω, an ion kinetic energy of >50 keV, and a repetition rate >1 Hz.

2. The method of claim 1, further including controlling the depth of surface treatment of the material by controlling the ion species comprising the ion beam.

3. The method of claim 1, further including controlling the depth of surface treatment of the material by controlling the kinetic energy level of the ion beam.

4. The method of claim 1 further including controlling the depth of surface treatment by controlling the duration of the ion beam pulse between ≧30 ns and ≦200 ns.

5. The method of claim 1, further including the step of surface treating at least 100 cm$^2$ with each pulse of the ion beam.

6. The method of claim 1, further including the step of surface treating 100 to 1000 cm$^2$ with each pulse of the ion beam.

7. The method of claim 1, further including the step of thermally quenching the irradiated surface of material.

8. The method of claim 7, wherein the rate of quenching the irradiated material is at least $10^8$ K/sec.

9. The method of claim 2, wherein the ion species are selected from the group consisting of argon, nitrogen, carbon, and protons.

10. The method of claim 1, wherein the ion species are produced from molecules selected from the group consisting of gases, vaporizable liquids, and vaporizable solids.

11. The method of claim 1 wherein the characteristic is the removal of surface contamination.

12. A method for altering the characteristics of a near surface layer of material, comprising:
   (a) generating a repetitively pulsed ion beam, wherein the ion beam has an ion kinetic energy level >0.1 MeV, a pulse duration of ≦500 ns at an accelerating gap between a cathode and an anode assembly, a total beam energy delivered to the material of >1 Joule/spatially contiguous pulse, an impedance of < about 100 Ω, and a pulse repetition rate >1 Hz; and
   (b) irradiating the surface of the material with the ion beam and thereby altering the near surface layer of the material defined by a predetermined depth from the irradiated surface.

13. The method of claim 12, further comprising varying the depth of the near surface layer thermally altered by controlling the kinetic energy of the ion species composing the ion beam.

14. The method of claim 12, further including varying the depth of the near surface layer thermally altered by varying the ion species composing the ion beam.

15. The method of claim 12, wherein the step of altering a near surface layer of material produces melting.

16. The method of claim 12, further including the step of thermally quenching the near surface layer of material.

17. The method of claim 16, wherein the rate of thermally quenching is at least $10^8$ K/sec.

18. The method of claim 16, wherein the step of thermally quenching further includes retaining non-equilibrium microstructrues within the near surface layer selected from the group consisting of: amorphous, disordered crystalline and nano crystalline phases.

19. The method of claim 12, further including the step of controlling the predetermined depth of altering of material to include an interface between a layer of a first material and a layer of a second material for bonding the first material to the second material, wherein the layers of the first and second materials are included within the near surface layer.

20. The method of claim 12 wherein the step of altering a near surface layer of material produces etching of polymers.

21. The method of claim 12 wherein the step of altering a near surface layer of material produces cross-linking of polymers.

22. The method of claim 12 wherein the step of altering a near surface layer of material produces polishing of the material.

23. The method of claim 12 wherein the step of altering a near surface layer of material produces cleaning of the material.

24. The method of claim 12 wherein the step of altering a near surface layer of material produces glazing of the material.

25. The method of claim 12 wherein the material is a metal and the characteristic is hardness.

26. The method of claim 25 wherein the metal is steel.

27. The method of claim 12 wherein the characteristic is surface smoothness.

28. The method of claim 27 wherein the material is a ceramic.

29. The method of claim 27 wherein the material is a metal composition.

30. An ion beam generator for altering near surface layers of materials, comprising:
   a) means for repetitively generating pulsed power signals at a rate >1 Hz, wherein the pulsed power signal has a duration of 30–500 ns, and
   b) means for generating an ion beam in a magnetically confined plasma with the pulsed power signal, whereby pulsed ion beams are produced at rates >1 Hz and 30–500 ns in duration at an accelerating gap between a cathode and an anode assembly with a total beam energy delivered to the material of >1 Joule/spatially contiguous pulse and an impedance of < about 100 Ω.

31. The ion beam generator of claim 30, wherein the means for generating an ion beam includes:
   an anode assembly comprising inner and outer anode rings defining an anode annulus there between,
   a cathode assembly comprising inner and outer cathode rings defining a cathode annulus there between wherein the inner and outer cathode rings also contain slow magnetic coils which, when energized, act to magnetically insulate the accelerating gap between the anode electrode rings and the cathode electrode rings,
   means to pre-ionize a gas introduced into the means for generating an ion beam, and
   means for completely ionizing the gas into the plasma and for moving the plasma comprising fast driving magnetic coil means which move the plasma towards and through the anode annulus into an accelerating gap between the anode assembly and the cathode assembly, wherein both the means to pre-ionize and the fast driving coil means are located to the side of the anode assembly opposite to the cathode assembly,
   wherein the inner and outer anode rings are configured so as to separate the magnetic field lines from the fast driving magnetic coil means from the magnetic field lines from the slow magnetic coils such that the magnetic field approaches zero across the cathode annulus at the time of beam acceleration and wherein the slow magnetic coils are located to the opposite side of the anode annulus relative to the fast driving magnetic coil means.

32. A process for uniformly altering a characteristic of a surface of a material to a depth of less than 50 microns by irradiating the surface with a repetitively pulsed ion beam, wherein each spatially contiguous pulse of the pulsed ion beam has a duration of ≦500 ns, a total beam energy delivered to the material of >1 Joule/pulse, an impedance of < 100 Ω, and a repetition rate >1 Hz, such that continuous areas in excess of 50 cm² are created with the altered characteristic by each pulse.

33. A process for uniformly altering a characteristic of a surface of a material to a depth of less than 50 microns by irradiating the surface with a repetitively pulsed ion beam, wherein each spatially contiguous pulse of the pulsed ion beam has a duration of ≦500 ns, a total beam energy delivered to the material of >1 Joule/pulse, an impedance of < 100 Ω, and a repetition rate >1 Hz, such that continuous areas in excess of 5 cm² are created with the altered characteristic by each pulse.

* * * * *